United States Patent
Bhagavat et al.

(10) Patent No.: US 11,011,466 B2
(45) Date of Patent: May 18, 2021

(54) INTEGRATED CIRCUIT PACKAGE WITH INTEGRATED VOLTAGE REGULATOR

(71) Applicant: ADVANCED MICRO DEVICES, INC., Santa Clara, CA (US)

(72) Inventors: Milind S. Bhagavat, Los Altos, CA (US); Rahul Agarwal, Livermore, CA (US); Chia-Hao Cheng, Hsinchu (TW)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 16/367,731

(22) Filed: Mar. 28, 2019

(65) Prior Publication Data

US 2020/0312766 A1  Oct. 1, 2020

(51) Int. Cl.
| | |
|---|---|
| *H01L 23/52* | (2006.01) |
| *H01L 23/528* | (2006.01) |
| *H01L 23/31* | (2006.01) |
| *H01L 23/522* | (2006.01) |
| *H01L 23/00* | (2006.01) |
| *H01L 21/56* | (2006.01) |
| *H01L 25/065* | (2006.01) |

(52) U.S. Cl.
CPC ........ *H01L 23/5283* (2013.01); *H01L 21/566* (2013.01); *H01L 23/3128* (2013.01); *H01L 23/5227* (2013.01); *H01L 24/09* (2013.01); *H01L 24/17* (2013.01); *H01L 25/0655* (2013.01); *H01L 2224/0231* (2013.01); *H01L 2224/02373* (2013.01); *H01L 2224/02379* (2013.01); *H01L 2224/02381* (2013.01); *H01L 2224/0401* (2013.01); *H01L 2924/1206* (2013.01); *H01L 2924/1427* (2013.01)

(58) Field of Classification Search
CPC ... H01L 23/52; H01L 23/5283; H01L 23/566; H01L 23/5227
USPC .......................................................... 257/737
See application file for complete search history.

(56) References Cited

U.S. PATENT DOCUMENTS

| | | | |
|---|---|---|---|
| 6,480,086 B1 * | 11/2002 | Kluge | H01F 17/0013 257/E21.022 |
| 7,198,980 B2 | 4/2007 | Jiang et al. | |

(Continued)

FOREIGN PATENT DOCUMENTS

WO   WO02013148932   10/2013

OTHER PUBLICATIONS

PCT/US2013/034242 International Preliminary Report on Patentability dated Oct. 1, 2014.

(Continued)

*Primary Examiner* — Chuong A Luu

(57) ABSTRACT

Various semiconductor chip devices and methods of making the same are disclosed. In one aspect, an apparatus is provided that includes a first redistribution layer (RDL) structure having a first plurality of conductor traces, a first molding layer on the first RDL structure, plural conductive pillars in the first molding layer, each of the conductive pillars including a first end and a second end, a second RDL structure on the first molding layer, the second RDL structure having a second plurality of conductor traces, and wherein some of the conductive pillars are electrically connected between some of the first plurality of conductor traces and some of the second plurality of conductor traces to provide a first inductor coil.

9 Claims, 7 Drawing Sheets

(56) References Cited

U.S. PATENT DOCUMENTS

| | | |
|---|---|---|
| 8,621,131 B2 | 12/2013 | Loh et al. |
| 2005/0167798 A1 | 8/2005 | Doan |
| 2006/0262573 A1 | 11/2006 | Elmala et al. |
| 2008/0272829 A1 | 11/2008 | Maeda |
| 2010/0052111 A1 | 3/2010 | Urakawa |
| 2010/0214746 A1 | 8/2010 | Lotfi et al. |
| 2011/0050334 A1 | 3/2011 | Pan et al. |
| 2011/0182039 A1 | 7/2011 | Kato et al. |
| 2013/0257525 A1 | 10/2013 | Kosonocky et al. |
| 2013/0302932 A1* | 11/2013 | Bustillo ............ C12Q 1/6869 438/49 |
| 2015/0061759 A1* | 3/2015 | de Rochemont ..... H01L 23/645 327/564 |
| 2015/0168972 A1 | 6/2015 | Mathiyalagan et al. |
| 2015/0235952 A1 | 8/2015 | Pan et al. |
| 2015/0371764 A1 | 12/2015 | Gordin et al. |
| 2016/0090294 A1 | 3/2016 | Wachter et al. |
| 2017/0040266 A1* | 2/2017 | Lin .................... H01L 23/5383 |
| 2017/0263518 A1 | 9/2017 | Yu et al. |
| 2018/0341613 A1 | 11/2018 | Yudanov et al. |
| 2019/0067253 A1 | 2/2019 | Nakano |
| 2019/0088595 A1 | 3/2019 | Yu et al. |

OTHER PUBLICATIONS

PCT/US2020/016773 International Search Report and Written Opinion dated May 29, 2020.

\* cited by examiner

US 11,011,466 B2

INTEGRATED CIRCUIT PACKAGE WITH INTEGRATED VOLTAGE REGULATOR

BACKGROUND OF THE INVENTION

Conventional integrated circuits are frequently implemented on a semiconductor substrate or die that consists of a small, often rectangular, piece of semiconductor material, typically silicon, fashioned with two opposing principal sides. The active circuitry for the die is concentrated near one of the two principal sides. A conventional die is usually mounted on some form of substrate, such as a package substrate or a printed circuit board. Electrical conductivity between the die and the underlying substrate or board is established through a variety of conventional mechanisms. In a so-called flip-chip configuration, the active circuitry side of the die is provided with a plurality of conductor balls or bumps that are designed to establish a metallurgical bond with a corresponding plurality of conductor pads positioned on the substrate or circuit board. The die is flipped over and seated on the underlying substrate with the active circuitry side facing downwards. A subsequent thermal process is performed to establish the requisite metallurgical bond between the bumps and the pads. One of the principal advantages of a flip-chip mounting strategy is the relatively short electrical pathways between the integrated circuit and the substrate. These relatively low inductance pathways yield a high speed performance for the electronic device.

Power is supplied to the substrate or circuit board from some external power supply, which might be on or connected to a system board. The input power is typically produced by a voltage regulator on the system board. A 3.3 volt regulated voltage is typical of present-day power supplies for integrated circuits. However, conventional semiconductor chips often require power at different voltage levels. Providing a regulated step down voltage, from say a 3.3 volt input, can produce surprisingly high currents. For example, an integrated circuit operating at 100 watts and 1 volt may draw nearly 100 amps of current. Conventional voltage regulators usually include an inductor and switching logic to charge and discharge the inductor according to some algorithm.

BRIEF DESCRIPTION OF THE DRAWINGS

The foregoing and other advantages of the invention will become apparent upon reading the following detailed description and upon reference to the drawings in which.

DETAILED DESCRIPTION

Figure 1:
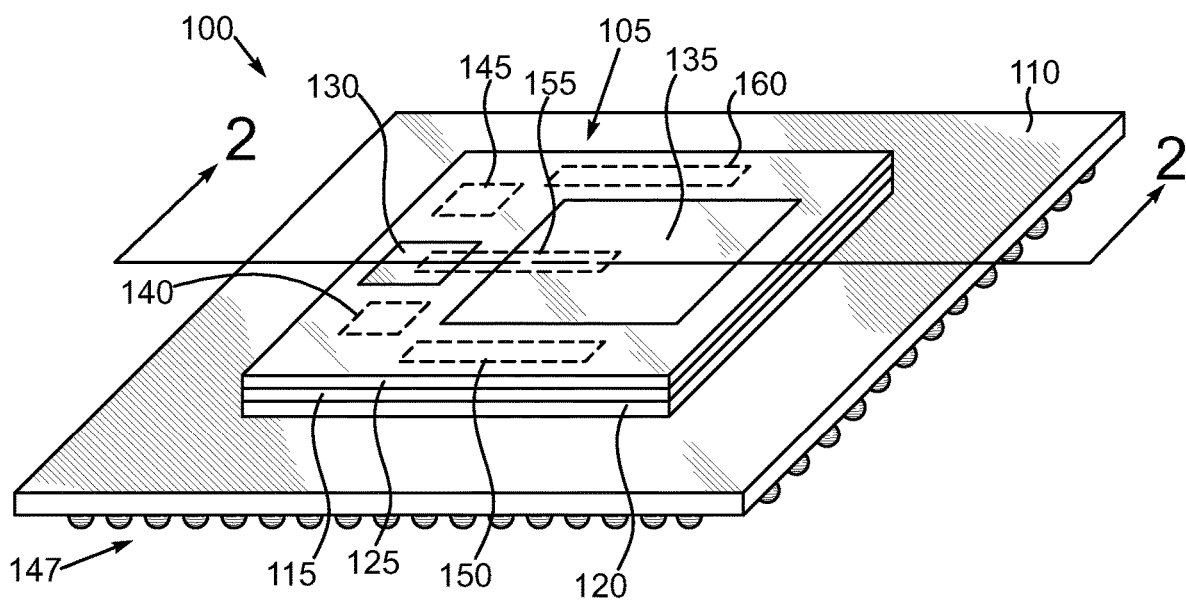
FIG. 1 is a pictorial view of an exemplary arrangement of a semiconductor chip device.

One potential conventional solution to provide regulated voltage would be to incorporate a regulator inductor into a semiconductor chip. However, integrated inductors for high current applications require very low resistance thick metals that are typically not present in today's semiconductor chip processing technologies. For example, current CMOS processes create top metal layers of too high a resistance to serve as an inductor without unacceptable $I^2R$ losses. Some conventional designs incorporate magnetic core inductors into a semiconductor chip. Such devices may have current limitations due to device geometry. Still other designs use inductors mounted to the surface of a package substrate, albeit with an attendant performance penalty associated with the path length from the inductor to the chip input/outputs (I/Os) where the regulated voltage is needed.

The disclosed arrangements provide a semiconductor chip package with an integrated voltage regulator. The voltage regulator is fabricated by positioning conductive pillars in a molding layer and using those conductive pillars along with conductor traces on opposite sides of the pillars to provide one or more inductor coils. The molding layer is sandwiched between redistribution layer (RDL) structures and one or more semiconductor chips are mounted on one of the RDL structures. Such inductor coils are configured like solenoids with coil axes oriented so that the generated magnetic fields do not project towards the semiconductor chips. The conductive pillars produce smaller $I^2R$ losses. The inductor coils do not take up space on package substrates. The molding layer is electrically insulating, which results in low coupling losses. In addition, inductor coils can be substantially co-axial and nested to produce multiple phases.

In accordance with one aspect of the present invention, an apparatus is provided that includes a first redistribution layer (RDL) structure having a first plurality of conductor traces, a first molding layer on the first RDL structure, plural conductive pillars in the first molding layer, each of the conductive pillars including a first end and a second end, a second RDL structure on the first molding layer, the second RDL structure having a second plurality of conductor traces, and wherein some of the conductive pillars are electrically connected between some of the first plurality of conductor traces and some of the second plurality of conductor traces to provide a first inductor coil.

The apparatus including control and switching logic connected to the inductor to provide a voltage regulator.

The apparatus including a first semiconductor chip mounted on the second RDL structure.

The apparatus wherein the first semiconductor chip comprises control and switching logic connected to the inductor to provide a voltage regulator.

The apparatus comprising a second molding layer on the second RDL structure at least partially encapsulating the first semiconductor chip.

The apparatus comprising a circuit board, the apparatus being mounted on the circuit board.

The apparatus comprising a high permeability core positioned inside the first inductor coil.

The apparatus wherein other of the conductive pillars are electrically connected between other of the first plurality of conductor traces and other of the second plurality of conductor traces to provide a second inductor coil.

The apparatus wherein the second inductor coil is substantially co-axial with the first inductor coil.

In accordance with another aspect of the present invention, a semiconductor chip device is provided that includes a first redistribution layer (RDL) structure having a first plurality of conductor traces, a first molding layer on the first RDL structure, plural conductive pillars in the first molding layer, each of the conductive pillars including a first end and a second end, a second RDL structure on the first molding layer, the second RDL structure having a second plurality of conductor traces, wherein some of the conductive pillars are electrically connected between some of the first plurality of conductor traces and some of the second plurality of conductor traces to provide a first inductor coil, and a first semiconductor chip mounted on the second RDL structure, the first semiconductor chip having voltage regulator switching and control logic connected to the first inductor coil to provide an integrated voltage regulator.

The semiconductor chip device comprising a second semiconductor chip mounted on the second RDL structure, the integrated voltage regulator being operable to supply a regulated voltage to the second semiconductor chip.

The semiconductor chip device comprising a second molding layer on the second RDL structure at least partially encapsulating the first semiconductor chip.

The semiconductor chip device comprising a circuit board, the semiconductor chip device being mounted on the circuit board.

The semiconductor chip device comprising a high permeability core positioned inside the first inductor coil.

The semiconductor chip device wherein other of the conductive pillars are electrically connected between other of the first plurality of conductor traces and other of the second plurality of conductor traces to provide a second inductor coil.

The semiconductor chip device wherein the second inductor coil is substantially co-axial with the first inductor coil.

In accordance with another aspect of the present invention, a method manufacturing is provided that includes fabricating a first redistribution layer (RDL) structure having a first plurality of conductor traces, fabricating a first molding layer on the first RDL structure, fabricating plural conductive pillars in the first molding layer, each of the conductive pillars including a first end and a second end, fabricating a second RDL structure on the first molding layer, the second RDL structure having a second plurality of conductor traces, and electrically connecting some of the conductive pillars between some of the first plurality of conductor traces and some of the second plurality of conductor traces to provide a first inductor coil.

The method comprising connecting control and switching logic to the inductor to provide a voltage regulator.

The method comprising mounting a first semiconductor chip on the second RDL structure.

The method wherein the first semiconductor chip comprises control and switching logic connected to the inductor to provide a voltage regulator.

The method comprising mounting the first RDL structure on a circuit board.

The method wherein the first semiconductor chip comprises control and switching logic connected to the inductor to provide a voltage regulator.

The method comprising fabricating a second molding layer on the second RDL structure at least partially encapsulating the first semiconductor chip.

The method comprising mounting the apparatus on a circuit board.

The method comprising a high permeability core positioned inside the first inductor coil.

The method comprising electrically other of the conductive pillars between other of the first plurality of conductor traces and other of the second plurality of conductor traces to provide a second inductor coil.

The method wherein the second inductor coil is substantially co-axial with the first inductor coil.

In the drawings described below, reference numerals are generally repeated where identical elements appear in more than one figure. Turning now to the drawings, and in particular to FIG. 1, therein is shown a pictorial view of an exemplary arrangement of a semiconductor chip device 100 that includes a molded fan-out package 105 mounted on a circuit board 110. The molded fan-out package 105 includes a RDL structure 115 that is sandwiched between a molding layer 120 and another molding layer 125. The molding layer 125 at least partially encases one or more semiconductor chips and in this illustrative arrangement semiconductor chips 130 and 135. In addition, the molding layer 125 can optionally encase one or more capacitors, two of which are shown and labeled 140 and 145, respectively, and are shown in phantom since they are obscured by the upper surface of the molding layer 125.

None of the arrangements disclosed herein is reliant on particular functionalities of the semiconductor chips 130 and 135 or the circuit board 110. Thus, the semiconductor chips 130 and 135 can be any of a variety of different types of circuit devices used in electronics, such as, for example, interposers, microprocessors, graphics processors, combined microprocessor/graphics processors, application specific integrated circuits, memory devices or the like, and can be single or multi-core. The semiconductor chips 130 and 135 can be constructed of bulk semiconductor, such as silicon or germanium, or semiconductor-on-insulator materials, such as silicon-on-insulator materials or even insulator materials. Thus, the term "semiconductor chip" even contemplates insulating materials. Stacked dice can be used if desired.

The circuit board 110 can be another semiconductor chip of the type described above, a semiconductor chip package substrate, a circuit card, or virtually any other type of printed circuit board. Monolithic or laminate structures could be used. A build up design is one example of a laminate. In this regard, the circuit board 110 can consist of a central core upon which one or more build-up layers are formed and below which an additional one or more build-up layers are formed. The core itself can consist of a stack of one or more layers. So-called "coreless" designs can be used as well. The layers of the circuit board 110 can consist of an insulating material, such as various well-known epoxies or other resins interspersed with metal interconnects. A multi-layer configuration other than buildup could be used. Optionally, the circuit board 110 can be composed of well-known ceramics or other materials suitable for package substrates or other printed circuit boards. The circuit board 110 includes plural I/Os 147, which can be the depicted solder balls, but could also be lands, pins or others.

Figure 2:
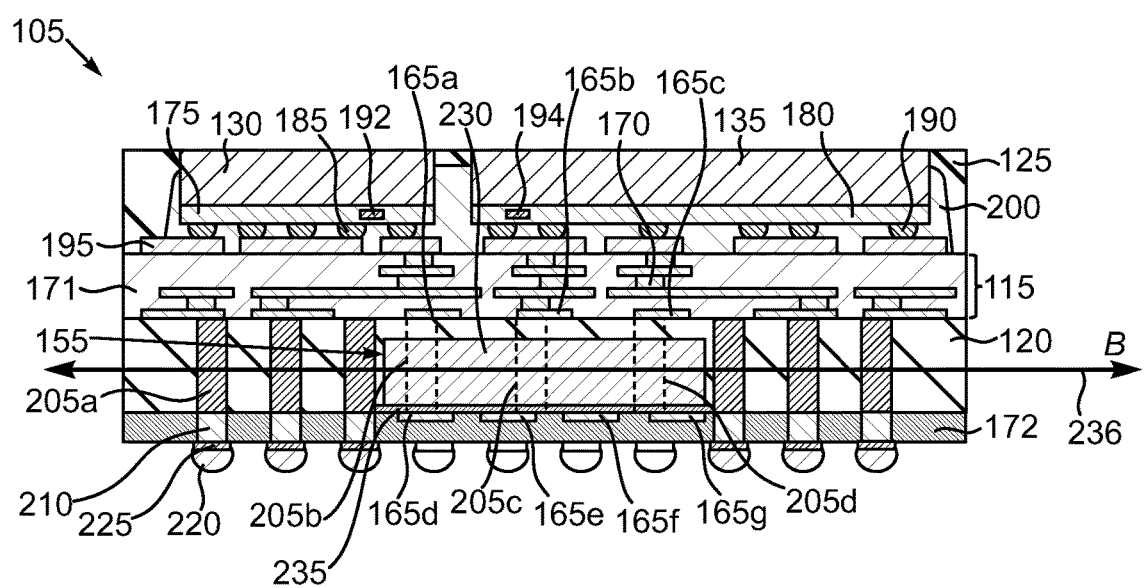
FIG. 2 is a sectional view of a portion of the device depicted in FIG. 1.

Additional details of the semiconductor chip device 100 can be understood by referring now also to FIG. 2, which is a sectional view of FIG. 1 taken at section 2-2, but without showing the circuit board 110. Note that because of the location of section 2-2, both the semiconductor chip 130 and the semiconductor chip 135 as well as portions of the molding layers 120 and 125 and the RDL structure 115 are shown in section. The molded fan-out package 105 includes one or more embedded inductors that are positioned inside the molding layer 120. There can be one or many such inductors. In this illustrative arrangement, three such inductors 150, 155 and 160 are depicted and shown in phantom since they are obscured by the molding layer 125, the RDL structure 115 and the molding layer 120. Note that because of the location of section 2-2, the embedded inductor 155 is also shown in section in FIG. 2. Before turning to the structure of the inductor 155 in detail, additional details regarding the molding layer 120, the RDL structure 115 and the molding layer 125 will now be described. The RDL structure 115 consists of one or more layers of metallization, such as the disclosed traces 165a, 165b and 165c interconnected with other traces by way of vias 170 and interspersed with one or more layers of insulating material 171. Additional conductor traces 165d, 165e, 165f and 165g are fabricated in another RDL structure 172 formed on the molding layer 120 opposite to the RDL structure 115. The traces 165a, 165b, 165c, 165d, 165e, 165f and 165g make up part of the inductor 155. The traces 165a, 165b, 165c, 165d, 165e, 165f and 165g and the vias 170 can be composed of a variety of conductor materials, such as copper, aluminum, silver, gold, platinum, palladium, titanium, refractory metals, refractory metal compounds, alloys of these or the like. In lieu of unitary structures, the traces 165a, 165b, 165c, 165d, 165e, 165f and 165g and the vias 170 can consist of a laminate of plural metal layers. However, the skilled artisan will appreciate that a great variety of conducting materials can be used for the traces 165a, 165b, 165c, 165d, 165e, 165f and 165g and the vias 170 Various well-known techniques for applying metallic materials can be used, such as physical vapor deposition (sputtering), chemical vapor deposition (CVD), plating or the like. The insulating material 171 can be composed of various dielectric materials, such as polyimide, polybenzoxazoles, benzocyclobutene or other polymers, and applied using well-known application and curing techniques.

The semiconductor chips 130 and 135 include device regions 175 and 180, respectively, that face toward the RDL structure 115 and are interconnected thereto by way of plural interconnects 185 and 190 respectively. The device regions 175 and 180 can include multitudes of circuit structures such as transistors, passive devices or other types of structures and multiple layers of metallization to ultimately connect to the interconnects 185 and 190 respectively. The device region 175 can include integrated voltage regulator circuitry 192 and the device region 180 can include integrated voltage regulator circuitry 194. The integrated voltage regulator circuitry 192 can be connected to one or more inductors, such as the inductors 145, 150, 155 etc. to provided an integrated voltage regulator. The integrated voltage regulator circuitry 194 can similarly be connected to one or more inductors, such as the inductors 145, 150, 155 etc. to provide to an integrated voltage regulator. The interconnects 185 and 190 are in turn connected to the RDL structure 115 by way of a metallization layer 195. The interconnects 185 and 190 can be solder bumps, solder micro bumps, connective pillars or other types of conductor structures. To lessen the effects of differences in CTE between the chips 130 and 135 and the other structures of the molded fan-out package 100, an underfill 200 can be positioned between the chips 130 and 135 and the RDL structure 115. The underfill 200 can be placed by capillary action after the mounting of the chips 130 and 135 or positioned prior to the mounting of the chips 130 and 135.

The molding layer 125 can be composed of various polymeric molding materials. Two commercial variants are Sumitomo EME-G750 and G760. Well-known compression molding techniques can be used to mold the molding layer 125. Here, the molding layer 125 is coterminous vertically with the upper surfaces of the chips 130 and 135. This can be accomplished by grinding or possibly by molding in such as way that the molding layer 125 does not cascade over the tops of the chips 130 and 135.

The molding layer 120 includes plural conductive pillars, a few of which are labeled 205a, 205b, 205c, 205d and 205e, that connect at their upper ends to one or more of the conductor traces 165a, 165b and 165c of the RDL structure 115 and at their lower ends to conductor structures 210 or the conductor traces 165d, 165e, 165f and 165g that are fabricated in the RDL structure 172. The molding layer 120 can be composed of the same types of materials and applied using the same techniques as the molding layer 125.

The RDL structure 172 can consist of the aforementioned conductor traces 165d, 165e, 165f and 165g and the conductor structures 210, which are depicted as vertically extending structures that can also include laterally extending traces or other types of RDL type metallization and one or more layers of a dielectric material such as polyimide, polybenzoxazoles, benzocyclobutene or other polymers, and applied using well-known application and curing techniques. Plural interconnects 220 project from the RDL structure 172 and are electrically connected to some of the conductive pillars, such as 205a, by way of the conductor structures 210 and I/O pads 225. Note that the conductive pillars 205b, 205c, 205d and 205e are not positioned in the same plane as other of the conductive pillars, such as the pillar 205a and others shown cross-hatched. The conductive pillars 205b, 205c, 205d and 205e are positioned farther into the page than the pillars 205a and thus obscured by the molding layer 120 and shown in phantom.

The embedded inductor 155 consists of the conductor traces 165a, 165b, 165c, 165d, 165e and 165f interconnected by the conductive pillars 205b, 205c, 205d and 205e as well as additional conductive pillars that are in the molding layer 120 but are positioned further out of the page than the section shown in FIG. 2 and thus not visible. The embedded inductor 155 can include an optional high permeability core 230 composed of ferrite or other high permeability materials that is secured to the RDL structure 215 by way of a suitable adhesive layer 235. The embedded inductor 155 in this illustrative arrangement is a solenoid coil with a coil axis 236 that does not pass through either of the semiconductor chips. The inductor 155 generates a magnetic field B that is substantially parallel to the coil axis 236. This arrangement imposes less electromagnetic interference on the semiconductor chips 130 and 135.

Figure 3:
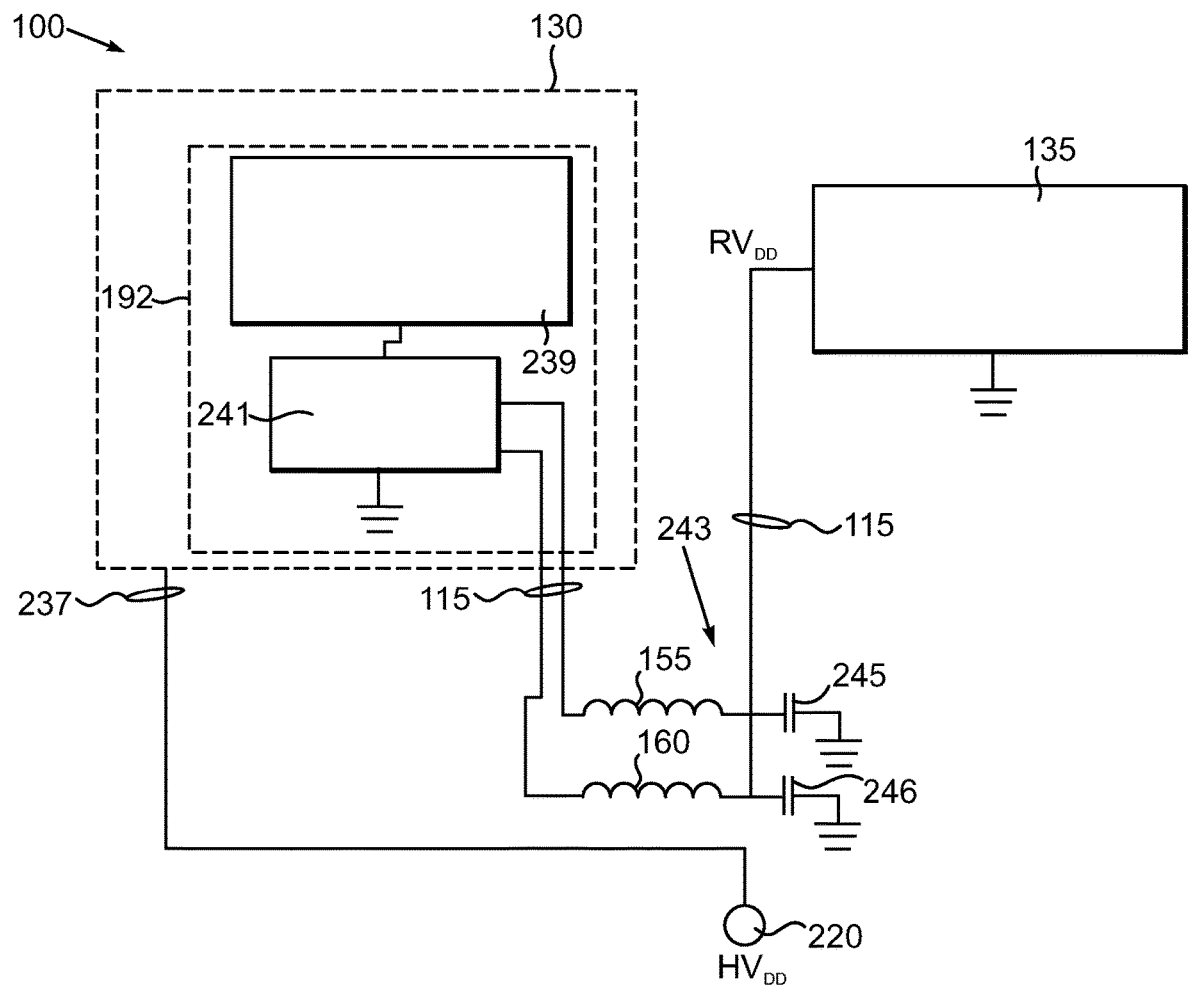
FIG. 3 is a schematic view of an exemplary integrated voltage regulator.

A variety of IVR architectures can be used with the semiconductor chip device 100 to supply regulated voltage power. An exemplary architecture and an exemplary electrical pathway associated with the chips 130 and 135 of the semiconductor chip device 100 will be described now in conjunction with FIG. 2 and also FIG. 3, which is a schematic diagram. A high voltage input $HV_{DD}$ (from a source, such as the circuit board 110 shown in FIG. 1 or another device not shown) is delivered to one of the I/Os 220 and, by way of an electrical pathway 237 to the voltage regulator circuitry 192 of the semiconductor chip 130. The electrical pathway 237 can include one or more of the conductive pillars 205a, etc., the RDL structure 115, the metal layer 195 and the interconnects 185. The voltage regulator logic 192 further includes a controller 239 and switching logic 241 that, together with a passive device circuit, such as passive device circuit 243, make up an IVR. The switching logic 241 is electrically connected to the passive device circuit 243 by way of the RDL structure 115. The passive device circuit 243 includes a pair of inductors, for example the inductors 155 and 160, and a pair of capacitors 245 and 246 (and optionally more than two of each) that are can be positioned on the chip 130 or elsewhere in the semiconductor chip device 100. The switching logic 241 includes two or more transistors to selectively pass current to the inductors 155 and 160 of the passive device circuit 243. The common output of the inductors 155 and 160 is provided as an input to the semiconductor chip 135 as a regulated voltage $RV_{DD}$ by way of the RDL structure 115. The outputs of the inductors 125 and 130 are also tied to ground by way of respective capacitors 245 and 246. The capacitors 245 and 246 could be internal or external to the semiconductor chip device 100 and number more than two. Thus, the semiconductor chip 135 is operable to receive the voltage input $HV_{DD}$ and, by way of the controller 239, the switching logic 241 and the passive device circuit 243, deliver the regulated voltage $RV_{DD}$ as an input to the semiconductor chip 135. The controller 239, the switching logic 241 and the inductors 155 and 160 and capacitors 245 and 246 are configured to function as a well-known buck regulator. The controller 239 can be implemented on the semiconductor chip 130 or as a discrete component. The switching logic 241 can be similarly implemented on the semiconductor chip 130 or as a discrete component. Indeed the controller 239 and the switching logic 241 can be integrated into a single device that is integrated into the semiconductor chip 130 as shown. It should be understood that the semiconductor chip 135 with its voltage regulator circuitry 194 can provide IVR functionality like the semiconductor chip 130 just described. It should be understood that multiple IVRs can be fabricated in or on a given chip, such as the semiconductor chips 130 and 135, and chained together. Of course, other IVR architectures that utilize inductors could be used.

Figure 4:
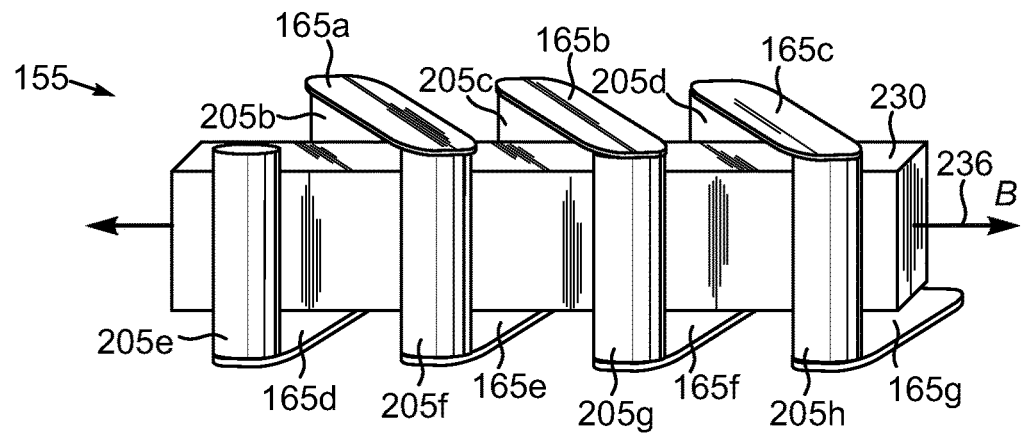
FIG. 4 is a pictorial view of an exemplary arrangement of an inductor.

Additional details of the embedded inductor 155 can be understood by referring now also to FIG. 4, which is a pictorial view of components of the embedded inductor 155 removed from the molding layer 120, the RDL structure 115 and the RDL structure 172 shown in FIG. 2. As just noted, the embedded inductor 155 can consist of the conductor traces 165a, 165b, 165c, 165d, 165e, 165f and 165g interconnected by way of the conductive pillars 205b, 205c, 205d, and the aforementioned pillars 205e, 205f, 205g and 205h that were not visible in FIG. 2. The high permeability core 230 is positioned inside the inductor coil that is made up by the aforementioned conductor traces 165a, 165b, 165c, 165d, 165e, 165f and 165g and the pillars 205b, 205c, 205d, 205e, 205f, 205g and 205h. Here, the high permeability core 230 is constructed with a rectangular cross section, however, other shapes could be used such as round or oval. It should be understood that the number of traces and pillars that make up the inductor 155 and disclosed alternatives can be varied. Indeed, it should be noted that the structures that make up a given inductor, such as the inductor 155 or any disclosed alternatives, can be constructed to deliver a desired inductance. For example, the widths, thicknesses, spacings, numbers and material compositions of the conductor traces 165a, 165b, 165c, 165d, 165e, 165f and 165g and the pillars 205b, 205c, 205d, 205e, 205f, 205g and 205h can be selected to yield a desired inductance. As noted above, the inductor 155 generates a magnetic field B that is preferably substantially aligned with the coil axis 236.

Figure 5:
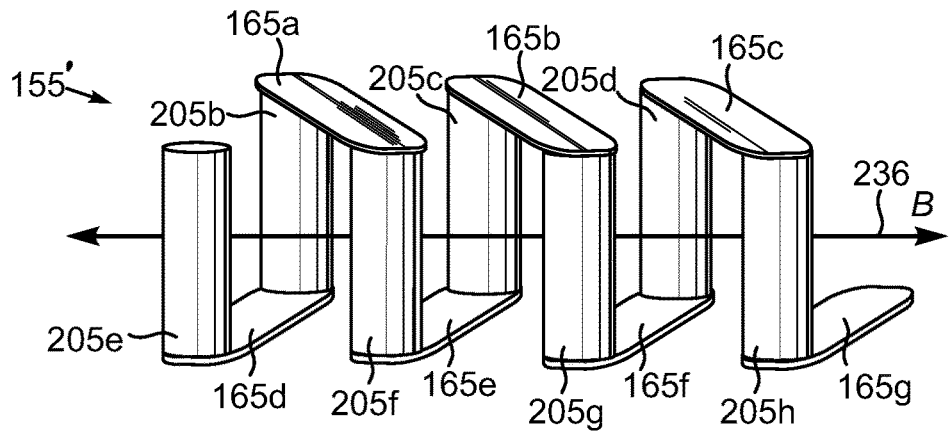
FIG. 5 is a pictorial view of an alternate exemplary arrangement of an inductor.

It should be understood that the high permeability core 230 is an optional feature. For example, and as shown in FIG. 5, which is a pictorial view of an alternate exemplary embedded inductor 155', the high permeability core 230 depicted in FIG. 3 can be omitted and the embedded inductor simply include the traces 165a, 165b, 165c, 165d, 165e, 165f and 165g interconnected by the conductive pillars 205b, 205c, 205d, 205e, 205f, 205g and 205h. Of course it should be understood that the ultimate input and output pathways for the embedded inductors 155 and 155' shown in FIGS. 4 and 5 are not shown for simplicity of illustration. The inductor 155' generates a magnetic field B that is preferably substantially aligned with the coil axis 236.

Figure 6:
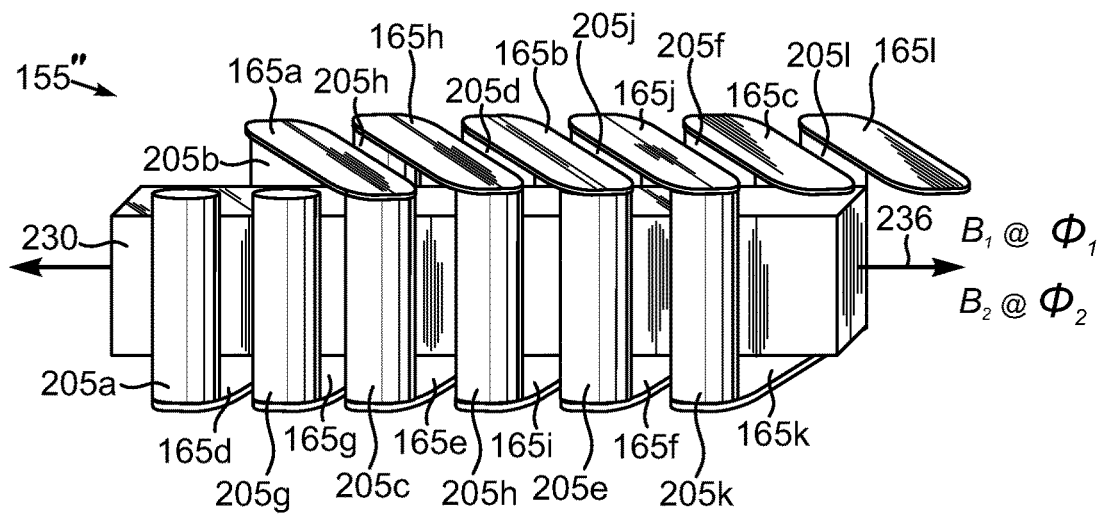
FIG. 6 is a pictorial view of an alternate exemplary arrangement of multiple inductors.

In yet another alternate exemplary arrangement of an embedded inductor 155" shown in FIG. 6, multiple inductor coils can be substantially co-axial or otherwise nested together to provide multiple phases. For example, the embedded inductor 155" can consist of one inductor that includes traces 165a, 165b and 165c, 165d, 165e and 165f and interconnected by conductive pillars 205a, 205b, 205c, 205d, 205e and 205f. This combination constitutes the first inductor that can be generating a first magnetic field $B_1$ at some first phase $\varphi_1$ and another substantially co-axial inductor that consists of conductor traces 165g, 165h, 165i, 165j, 165k and 165l interconnected by way of conductive pillars 205g, 205h, 205i, 205j, 205k and 205l generating a second magnetic field $B_2$ at some second phase $\varphi_2$ where $B_1$ and $B_2$ are substantially aligned with the coil axes 236. In this illustrative arrangement there are two inductors nested together to provide multiple phases. However, the skilled artisan will appreciate that more than two inductors could be nested together in the same general location as shown in FIG. 6 with or without the high permeability core 230.

Figure 7:
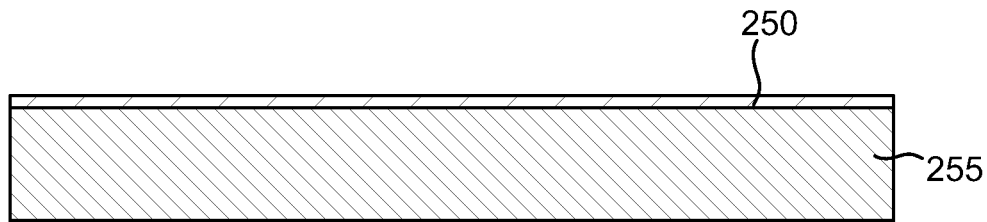
FIG. 7 is a sectional view depicting exemplary processing of a carrier wafer to fabricate a semiconductor device.
Figure 8:
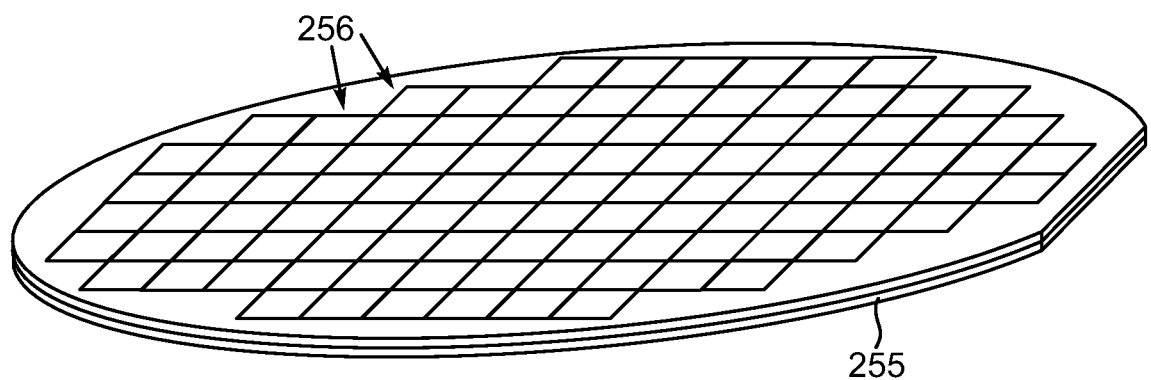
FIG. 8 is a pictorial view of the exemplary carrier wafer.
Figure 9:
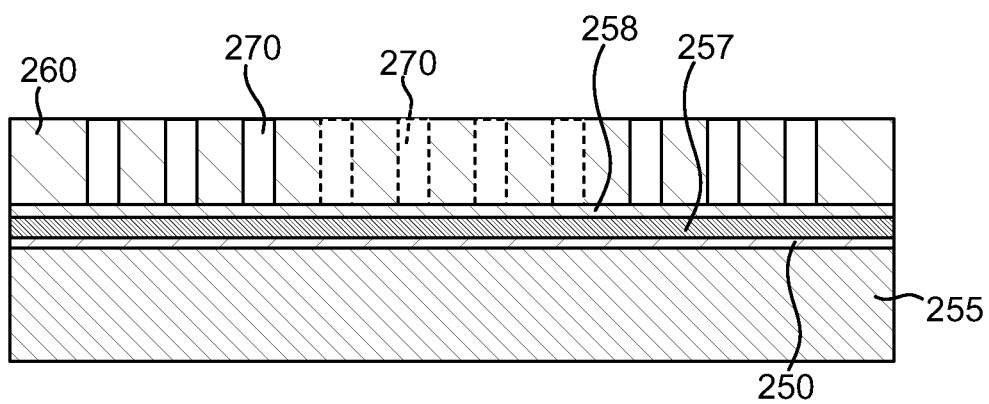
FIG. 9 is a sectional view like FIG. 7, but depicting exemplary processing to fabricate plural conductive pillars.

An exemplary method for fabricating the molded fan-out package 100 depicted in FIGS. 1 and 2 can be understood by referring now to FIGS. 7, 8, 9, 10, 11, 12, 13, 14, 15, 16 and 17 and initially to FIG. 7. The following description will focus on the construction of the inductor 155, but will be illustrative of the construction of the other inductors 150 and 160 as well. The process begins with the fabrication of the structures associated with the conductive pillars 205a, 205b and 205c, etc. As shown in FIG. 7, a release layer 250 is applied to a carrier wafer 255. The release layer 250 can be a light activated, thermally activated, or other type of adhesive or even some form of tape that can enable the carrier wafer 255 to be removed without destructively damaging the structures mounted thereon at the time of separation. The carrier wafer 255 can be composed of various types of glasses or even semiconductors, such as silicon. This and subsequent processing can be performed on a wafer level as depicted in FIG. 8, which shows the release layer 250 applied to the carrier wafer 255. The rectangular boxes 256 represent schematically the locations where individual molded packages will be singulated in subsequent processing. As shown in FIG. 9, a dielectric layer 257 is applied to the release layer 250. The dielectric layer 257 will eventually make up part of the RDL structure 172 depicted in FIG. 2. If the RDL structure 172 depicted in FIG. 2 will include multiple metal layers, then multiple layer of dielectric materials can be applied and interspersed with metallization as desired. A plating seed layer 258 is applied to the dielectric layer 257. The plating seed layer 258 can be composed of a variety of materials that are suitable for plating seed layers, such as copper or the like, and applied by well-known sputtering, chemical vapor deposition, electroless plating or the like. A photolithography mask 260 is applied to the plating seed layer 258 and patterned photolithographically to produce plural openings 270, which will be used to plate the conductive pillars 205*a*, etc. The photolithography mask 260 can be composed of negative tone or positive tone resist as desired. Note that some of the openings 270 are not in the same plane as others and thus are shown in phantom. The openings 270 shown in phantom will be the locations where, for example, conductive pillars 205*a*, 205*b*, 205*c*, 205*d* and 205*e* shown in FIG. 2 will be fabricated. For simplicity of illustration, the plating seed layer 258 will not be shown in other figures.

Figure 10:
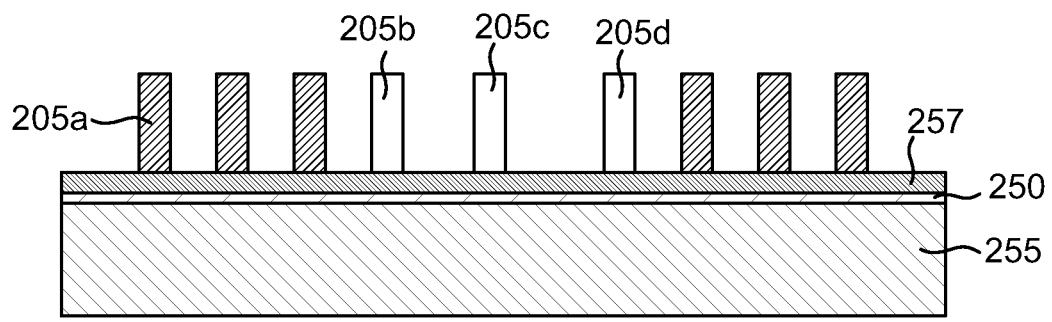
FIG. 10 is a sectional view like FIG. 9, but depicting exemplary additional processing to fabricate plural conductive pillars.

As shown in FIG. 10, with the photolithography mask 260 in place and patterned, a plating process is performed to fabricate the conductive pillars 205*a*, 205*b*, 205*c*, 205*d* and 205*e* and the photolithography mask 260 is stripped using ashing, solvent stripping or the like to yield the conductive pillars 205*a*, 205*b*, 205*c* and 205*d* (and others unlabeled). Portions of the plating seed layer 258 (not shown) on the dielectric layer 257 lateral to the pillars 205*a*, 205*b*, 205*c* and 205*d* are etched using well-known etch techniques. At this stage, the dielectric layer 257 remains attached to the carrier wafer 255 by the release layer 250.

Figure 11:
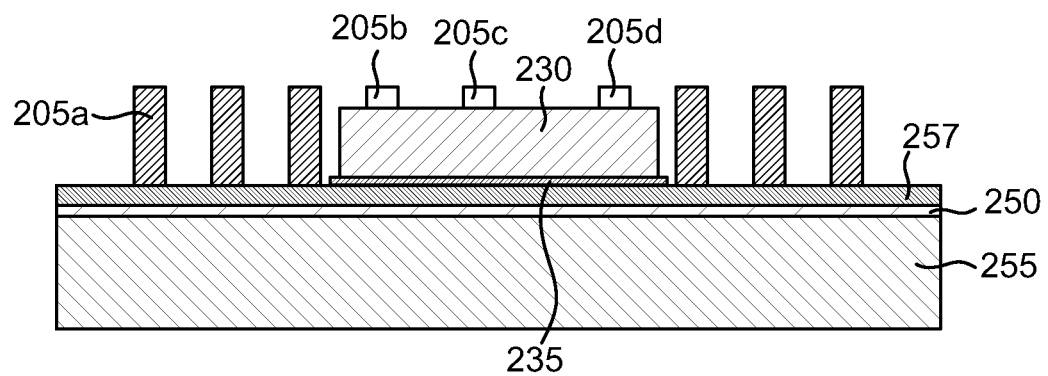
FIG. 11 is a sectional view like FIG. 10, but depicting exemplary processing to position an optional high permeability inductor core.

Next and as shown in FIG. 11, the optional high permeability core 230 is mounted on the polymer dielectric layer 258 and secured thereto by way of the aforementioned adhesive 235. It should be remembered that some of the conductive pillars 205*b*, 205*c* and 205*d*, for example, are positioned farther into the page than, for example, the conductive pillar 205*a* and its adjacent unlabeled pillars. Therefore, the majority of the pillars 205*a*, 205*b*, 205*c* and 205*d* are obscured by the placement of the high permeability core 230. Of course, there can be multiple high permeability cores 230 placed if multiple inductors 150, 155, 160 etc. are constructed. It should also be understood that other pillars serving as inductor components or not are constructed elsewhere on the dielectric layer 257. At this stage, the dielectric layer 257 remains attached to the carrier wafer 255 by the release layer 250.

Figure 12:
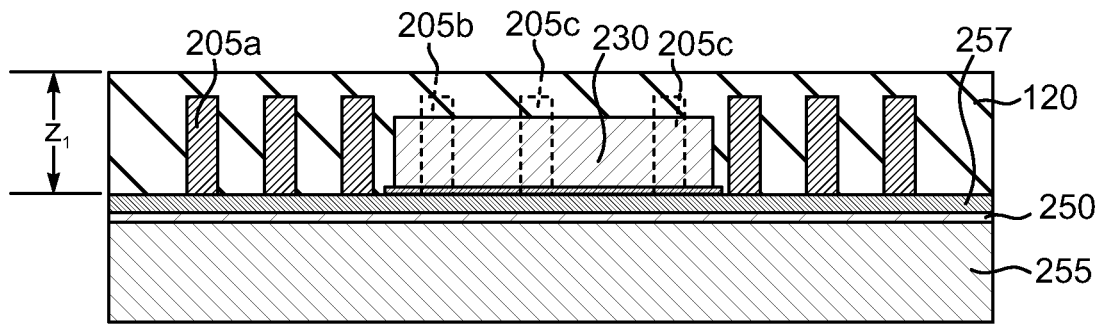
FIG. 12 is a sectional view like FIG. 11, but depicting exemplary processing to fabricate a molding layer around the conductive pillars.

Next and as shown in FIG. 12, the molding layer 120 is applied on the dielectric layer 257 over the pillars 205*a*, 205*b*, 205*c* and 205*d* and the optional high permeability core 230 using well-known compression molding techniques. The molding layer 120 is applied with some initial height $z_1$ that is taller than the embedded conductive pillars 205*a*, 205*b*, 205*c* and 205*d*. At this stage, the dielectric layer 257 remains attached to the carrier wafer 255 by the release layer 250.

Figure 13:
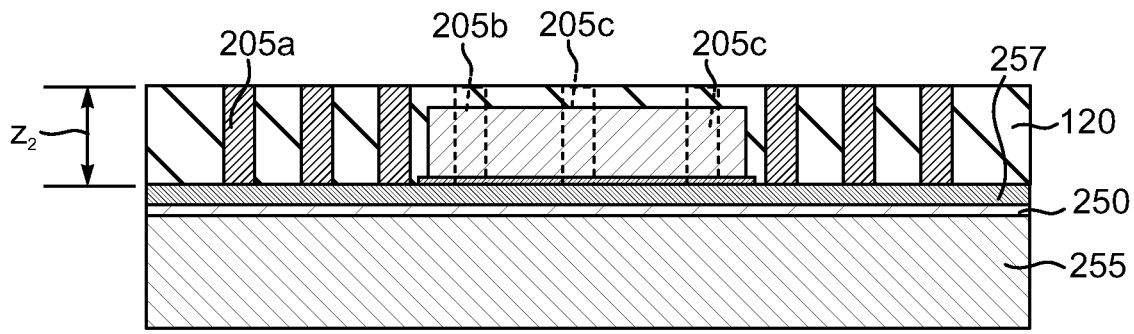
FIG. 13 is a sectional view like FIG. 12, but depicting exemplary additional processing to fabricate the molding layer.

Next and as shown in FIG. 13, a grinding process is performed on the molding layer 120 to expose the tops of the conductive pillars 205*a*, 205*b*, 205*c* and 205*d*. This reduces the height of the molding layer 120 to some new height $z_2$. At this stage, the dielectric layer 257 remains attached to the carrier wafer 255 by the release layer 250.

Figure 14:
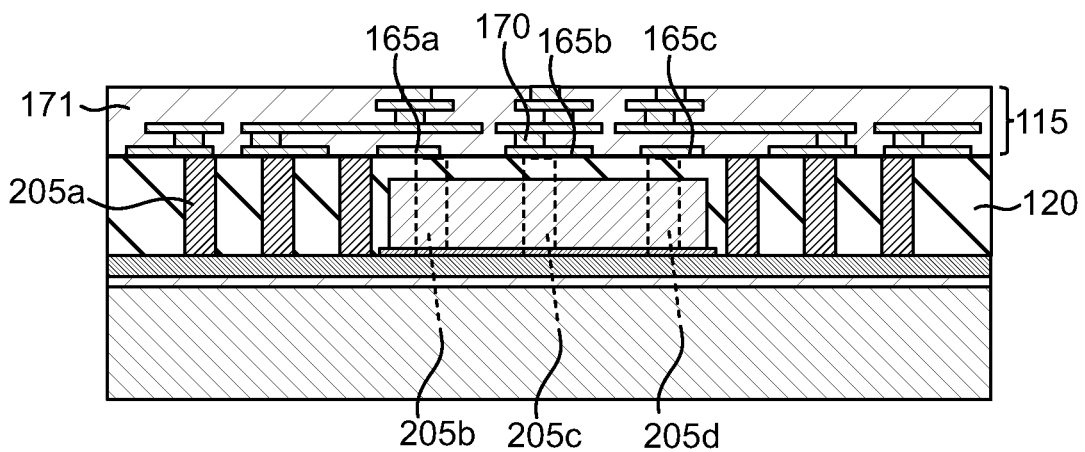
FIG. 14 is a sectional view like FIG. 13, but depicting exemplary processing to fabricate a redistribution layer (RDL) structure on the molding layer.

Next and as shown in FIG. 14, a multitude of steps are performed to fabricate the RDL structure 115 on the molding layer 120. These include well-known material deposition and patterning techniques and can be either additive or subtractive techniques to establish the conductor traces 165*a*, 165*b* and 165*c* in electrical contact with the conductive pillars 205*b*, 205*c* and 205*d* and the others that are depicted but not separately labeled as well as the vias 170 and the various dielectric layers 171. The fabrication of the multiple dielectric layers 171 can include application and baking processes as necessary. At this stage, the dielectric layer 257 remains attached to the carrier wafer 255 by the release layer 250.

Figure 15:
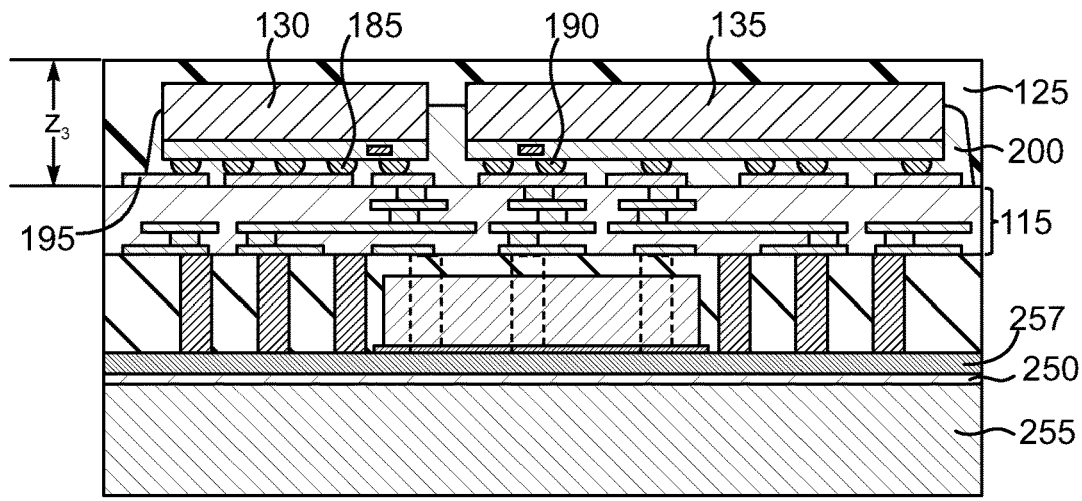
FIG. 15 is a sectional view like FIG. 14, but depicting exemplary processing to mount one or more semiconductor chips on the RDL structure.

Next and as shown in FIG. 15, the metallization layer 195 is fabricated on the RDL structure 115, again using well-known material application and patterning techniques. The semiconductor chips 130 and 135 are next mounted on the metallization layer 195 and interconnected thereto by way of the aforementioned interconnects 185 and 190, respectively. This can entail a solder reflow if the interconnects are composed of or otherwise use solder. The underfill 200 can be applied before or after the mounting of the chips 130 and 135 as discussed above and subjected to a bake process to harden it. Next, the molding layer 125 is formed by well-known compression molding techniques. The molding layer 125 can be applied with some initial height $z_3$ which at least partially encases the semiconductor chips 130 and 135 and can be above the upper surfaces thereof as shown or at a lower elevation if desired. A grinding operation can be used to tailor the post-molding height of the molding layer 125 to that depicted in FIG. 2. At this stage, the dielectric layer 257 remains attached to the carrier wafer 255 by the release layer 250.

Figure 16:
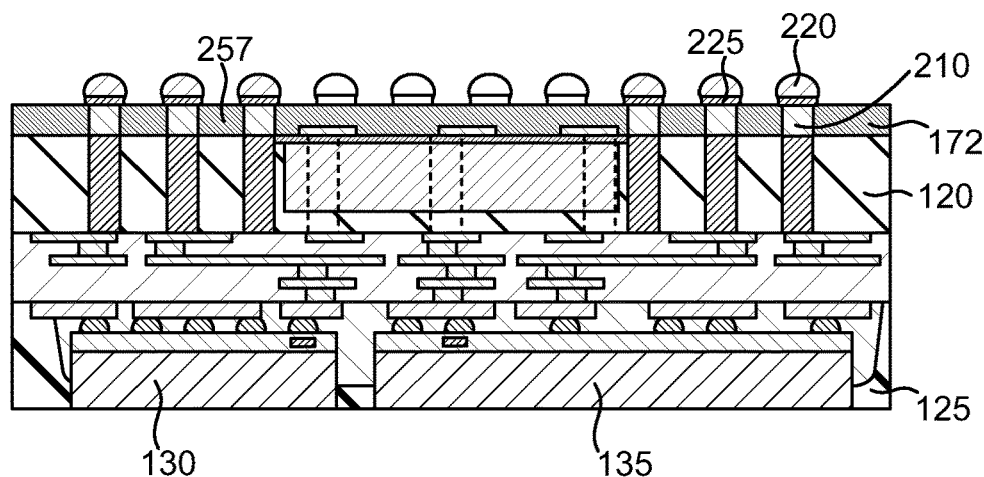
FIG. 16 is a sectional view like FIG. 15, but depicting exemplary processing to fabricate interconnects.

Next, and as shown in FIG. 16, the carrier wafer 255 can be removed by either activating the release layer 250 or some other non-destructive means and the combination of the molding layers 120 and 125 and the chips 130 and 135 flipped over from the orientation shown in FIG. 15 and the dielectric layer 257 can be patterned appropriately to provide suitable openings in which the conductor structures 210 can be formed by well-known material deposition techniques such as sputtering, CVD or the like to fabricate the RDL structure 172. Thereafter, the I/O pads 225 can fabricated using well-known sputtering, plating or the like. The interconnects 220 can be mounted or otherwise formed on the pads 225 using well-known plating, sputtering, pick and place or the like.

Figure 17:
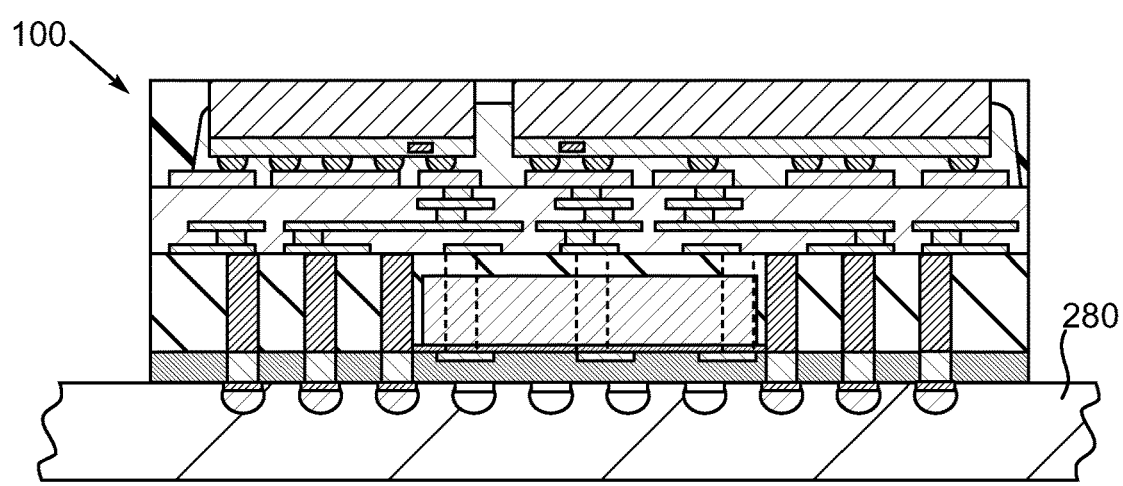
FIG. 17 is a sectional view like 16, but depicting exemplary processing to attach dicing tape and perform singulation.

As shown in FIG. 17, a dicing tape 280 can be applied to the side of the molded fan-out package 100 and a dicing operation can be performed to singulate it from the others that made up a reconstituted wafer. The dicing tape 280 is subsequently removed and the molded fan-out package 100 can be mounted to the circuit board 110 shown in FIG. 1.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. An apparatus, comprising:
   a first redistribution layer (RDL) structure having a first plurality of conductor traces;
   a first molding layer on the first RDL structure;
   plural conductive pillars in the first molding layer, each of the conductive pillars including a first end and a second end;
   a second RDL structure on the first molding layer, the second RDL structure having a second plurality of conductor traces; and
   wherein some of the conductive pillars are electrically connected between some of the first plurality of conductor traces and some of the second plurality of conductor traces forming a first inductor coil.

2. The apparatus of claim 1, comprising control and switching logic connected to the inductor to provide a voltage regulator.

3. The apparatus of claim 1, comprising a first semiconductor chip mounted on the second RDL structure.

4. The apparatus of claim 3, wherein the first semiconductor chip comprises control and switching logic connected to the inductor to provide a voltage regulator.

5. The apparatus of claim 3, comprising a second molding layer on the second RDL structure at least partially encapsulating the first semiconductor chip.

6. The apparatus of claim 1, comprising a circuit board, the apparatus being mounted on the circuit board.

7. The apparatus of claim 1, comprising a high permeability core positioned inside the first inductor coil.

8. The apparatus of claim 1, wherein other of the conductive pillars are electrically connected between other of the first plurality of conductor traces and other of the second plurality of conductor traces to provide a second inductor coil.

9. The apparatus of claim 8, wherein the second inductor coil is substantially co-axial with the first inductor coil.

* * * * *